United States Patent [19]

Smutny

[11] 4,163,189

[45] Jul. 31, 1979

[54] TRANSFORMER WITH A FERROMAGNETIC CORE FOR D-C AND A-C SIGNALS

[75] Inventor: Kurt Smutny, Neunkirchen, Fed. Rep. of Germany

[73] Assignee: Siemens Aktiengesellschaft, Munich, Fed. Rep. of Germany

[21] Appl. No.: 802,036

[22] Filed: May 31, 1977

[30] Foreign Application Priority Data

Jun. 4, 1976 [DE] Fed. Rep. of Germany ....... 2625354

[51] Int. Cl.² .......................................... H01F 21/08
[52] U.S. Cl. ........................................... 323/6; 323/56
[58] Field of Search ..................... 323/6, 48, 56, 57; 324/117 R, 127

[56] References Cited

U.S. PATENT DOCUMENTS

| | | | |
|---|---|---|---|
| 3,497,793 | 2/1970 | Gasparini et al. | 323/57 X |
| 3,708,749 | 1/1973 | Bateman et al. | 324/127 |
| 3,818,337 | 6/1974 | Groenenbroom et al. | 324/127 |
| 3,916,310 | 10/1975 | Stark et al. | 323/6 X |
| 4,023,100 | 5/1977 | Smutny | 324/127 X |

*Primary Examiner*—A. D. Pellinen
*Attorney, Agent, or Firm*—Kenyon & Kenyon

[57] ABSTRACT

A transformer with a ferromagnetic core for d-c and a-c signals includes at least one primary winding and at least one secondary winding and has a control device for changing the permeability of the core, a measuring device for measuring the change of the magnetic flux or the magnetization (ampere-turns) occurring with a permeability change, and a supplemental current source controlled in dependence on the change of the magnetic flux or the change of the magnetization connected to the secondary winding.

15 Claims, 5 Drawing Figures

TRANSFORMER WITH A FERROMAGNETIC CORE FOR D-C AND A-C SIGNALS

BACKGROUND OF THE INVENTION

This invention relates to transformers in general and more particularly to an improved transformer for d-c and a-c signals for use in computer and control applications.

Transformers with a ferromagnetic core for d-c and a-c signals are required for separating potentials in control and computer systems. In a process which is to be automated, a multiplicity of electrical signals is collected which are passed on to an electronic arrangement for further processing. For this purpose it is necessary to bring these electrical signals to the potential of the control or computer system which processes them further. In addition, the transposition of the electrical signals to the other potential must be carried out with great accuracy, since, in the last analysis, the accuracy of the control or computing process depends thereon. The electrical signals collected in a process which is to be automated as a rule contain and a-c and a d-c quantity. Therefore, it is not possible to obtain sufficiently accurate potential separation with customary transformers.

SUMMARY OF THE INVENTION

It is an object of the present invention to design a transformer which has a ferromagnetic core for d-c and a-c signals in such a manner that it can transmit such signals with great accuracy.

According to the present invention, the object is attained by providing a control device for changing the permeability of the core, of a transformer equipped with at least one primary and a secondary winding, and a measuring device for measuring a change of the magnetic flux which occurs when the permeability is changed, and by connecting a supplemental current source controlled in dependence of the change of the magnetic flux to the secondary winding. A further embodiment for attaining this object includes a control device for changing the permeability of the core of a transformer equipped with at least one primary and a secondary winding, and a measuring device for measuring a change of the magnetization (ampere-turns) occurring in the event of a change of the permeability and a supplemental current source which is controlled in dependence on the change of the magnetization connected to the secondary winding.

If a signal to be transmitted contains a d-c component besides an a-c component, currents result which are different on the primary and secondary side and which lead to a resultant magnetization in the ferromagnetic core of the transformer. If the permeability of the core is changed, such a magnetization leads to a flux change, which is measured and is used to control the supplemental current source. The supplemental current source is controlled so that the supplemental current fed by it into the secondary winding makes the resultant magnetization zero. Thus, the current flowing in the secondary winding corresponds exactly to the current in the primary winding.

Changing the permeability of the core is possible in a simple manner where the control device consists of a supplemental winding which is acted upon by a periodically changing current and by which an extra magnetic flux, which is independent of the magnetic flux of the primary and secondary winding, is produced in the core. Likewise, the change of the magnetic flux can be measured in a simple manner by providing an auxiliary winding, which is linked to the same magnetic flux as the primary and secondary winding, as the measuring device.

According to another embodiment of the present invention a simple transformer is obtained where the core is of the E-type and carries the primary, secondary and auxiliary windings, on its middle leg. Two series connected subwindings with the same number of turns are arranged on the two outer legs as the supplemental winding with the sense of the winding such that the outer legs are magnetized in opposite direction. It is also possible to use a transformer having a cup core. Since such a core contains a central hole, it is possible to lead one current carrying conductor through the center hole as the supplemental winding. This permits arranging the cores of several transformers on a common, current carrying conductor. Thus, only one current source supplying periodically changing current is required for a multiplicity of transformers.

Accurate control of the supplemental current fed into the secondary winding is possible in a simple manner where the supplemental current source consists of an amplifier which has its output connected to the secondary winding and its input connected to an integrating member, to the input of which is in turn applied the voltage which is induced in an auxiliary winding multiplied, in a multiplier stage, by the first derivative of the square of the current of the supplemental winding.

By impressing a current which changes between a positive and a negative maximum of equal magnitude on the supplemental winding, null errors of the transformer, which are due to unavoidable manufacturing tolerances of the core, are avoided. If the current were changed between two values which lie either only in the positive or only in the negative region, inequalities in the core caused by manufacturing tolerances would lead to a null shift of the transformer. In addition, the value of the positive and negative maximum can be limited as a function of the flux deviation produced by the supplemental winding. This is of advantage if magnetic materials or core shapes are used in which the dependence of the permeability on the induction is more reproducible than the dependence of the permeability on the field strength.

DETAILED DESCRIPTION OF THE INVENTION

Figure 1:
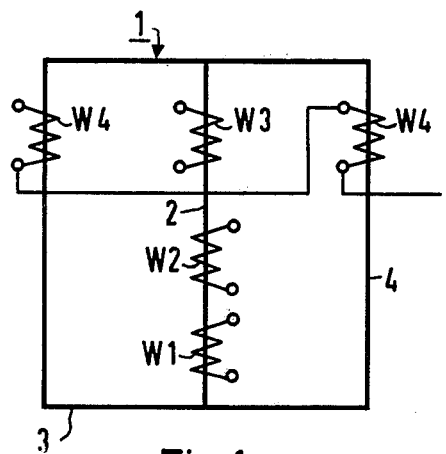
FIG. 1 is a schematic diagram of a transformer with E-type core.

The transformer shown in FIG. 1 has an E-type core 1. On the middle leg 2 of this E-type core 1 are arranged a primary winding W1, a secondary winding W2 and an auxiliary winding W3. On the two outer legs 3 and 4 are provided two series connected subwindings with the same number of turns, which together form a supplemental winding W4. The winding sense of the two subwindings is chosen so that when current flows in the two subwindings, the two outer legs 3 and 4 are magnetized in opposite directions.

Figure 2:
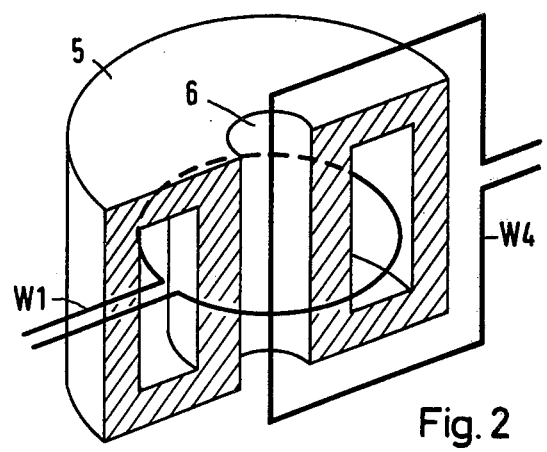
FIG. 2 is a perspective schematic view, partially in cross section, of a transformer with a cup core.

In the transformer shown in FIG. 2, a cup core 5, known per se, is used. The cup core 5 has a central hole 6, through which the supplementary winding W4 is led. This supplementary winding W4 may consist of a single conductor. In the usual winding space of the cup core are accommodated the primary winding W1, the secondary winding W2 and the auxiliary winding. Of these windings, only the primary winding W1 is shown in FIG. 2 for the sake of clarity.

Figure 3:
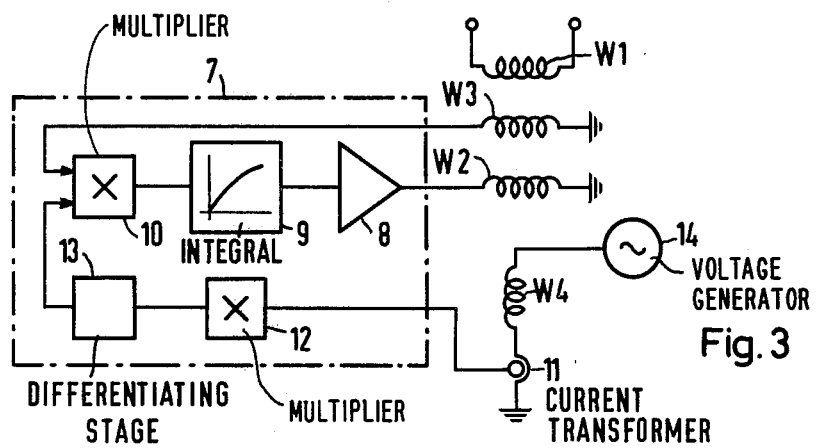
FIG. 3 is a schematic diagram of a transformer with a controlled supplemental current source.

If FIG. 3, a supplementary current source 7 is connected to the secondary winding W2. This supplementary current source consists of an amplifier 8, the output of which is connected to the secondary winding W2. The input of the amplifier 8 is connected to the output of an integrating member 9. The input of the integrating member 9 is connected to a first multiplier stage 10. The voltage induced in the auxiliary winding W3 is fed to the one input of this multiplier stage. To the other input of this multiplier stage 10, a signal having the sign of the first derivative of the square of the current of the supplemental winding W4 is applied. For this purpose, a current transformer 11 is connected in series with the supplemental winding W4. The secondary winding of this current transformer 11 is connected to a second multiplier stage 12, in which the square of the supplementary current flowing in the supplemental winding W4 is formed. In a differentiating stage 13 following the second multiplier stage 12, the derivative of the signal supplied by the second multiplier stage 12 is formed. The differentiating stage 13 is designed so that a signal having the sign of the respective derivative value appears at its output. For example, it can comprise a high gain amplifier with a capacitor at its input and its output limited to predetermined positive and negative voltage values. The supplemental winding W4 is connected to a generator 14, which supplies a periodically changing current. The generator 14 may be designed, for instance, as a clock generator.

If a signal containing a d-c and a-c component is applied to the primary winding W1, then the a-c component of the signal is developed in the secondary winding W2 with great accuracy, i.e., an a-c current of the same size as in the primary winding flows in the secondary winding. The d-c component flowing in the primary winding W1, on the other hand, leads to a resultant magnetization. Due to the periodically changing current flowing in the supplemental winding W4, the permeability of the core 1 is changed periodically. Due to the permeability change, a periodic flux change occurs under the influence of the existing resulting magnetization. This periodic flux change induces a voltage in the auxiliary winding W3. This voltage is weighted with the first derivative of the square of the current fed into the supplemental winding W4, or only with constant signal having the sign of this first derivative. The signal obtained in this manner serves to control the current to be fed into the secondary winding.

The current fed into the secondary winding W2 from the supplemental current source 7 is d-c current and its magnitude is controlled so that the resultant magnetization becomes zero. This is the case if the current flowing in the secondary winding is exactly as large as the current flowing in the primary winding. Thus, an accurate transmission of the d-c and a-c components of a signal is achieved.

The induced voltage required for controlling the supplemental current fed into the secondary winding can also be taken off at the secondary winding W2. This saves the separate auxiliary winding W3, but at the expense of the accuracy of the transformer.

Figure 4:
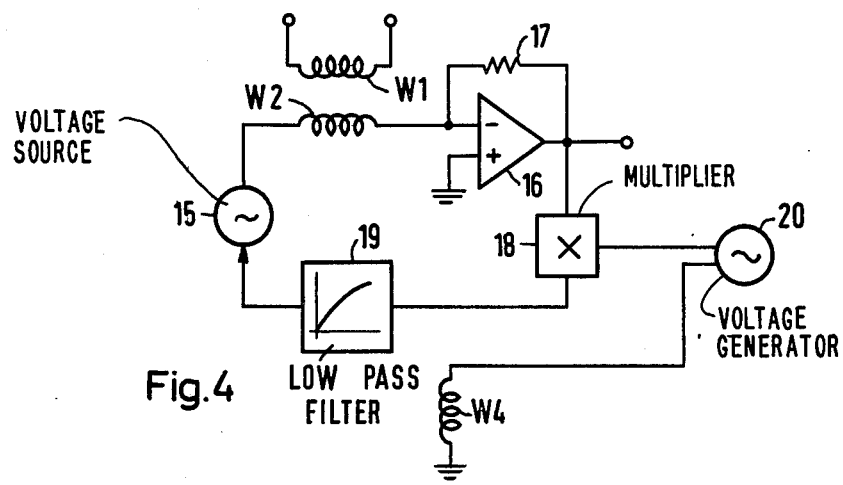
FIG. 4 is a schematic diagram of a transformer with a short circuited secondary winding.

In the transformer according to FIG. 4, a supplemental voltage source 15 is connected to one terminal of the secondary winding W2 and the inverting input of an operational amplifier 16 to the other terminal. The output of the operational amplifier 16 is fed back to the inverting input via an ohmic resistor 17. This feedback keeps the inverting input of the operational amplifier at zero, so that the secondary winding W2 operates in a short circuited condition.

One input of a third multiplier stage 18 is also connected to the output of the operational amplifier 16. The output of multiplier stage 18 is connected, via a smoothing member designed as a lowpass filter 19, to the control input of the supplemental voltage source 15. The other input of the third multiplier stage 18 is connected to an output of a frequency generator 20. The supplemental winding W4 is connected to another output of this frequency generator 20. The generator 20 is designed so that it delivers a signal having a frequency twice that of the signal delivered to the supplemental winding W4 and the phase of which coincides with the fundamental of the square of the signal delivered to the supplemental winding at the output connected to the multiplier stage 18.

In the transmission of a signal containing a d-c and an a-c component, the d-c component again leads to a resultant magnetization. Contrary to the transformer according to FIG. 3, the change of the magnetization is measured in the transformer according to FIG. 4, the flux being kept constant by controlling the supplemental voltage source 15 when the permeability changes. The supplemental voltage source 15 always feeds a current into the secondary winding W2 which is such that the magnetic flux remains constant if a change in the permeability is brought about by the current flowing in the supplemental winding W4. The magnetic flux remains constant when the sum of the a-c component induced in the secondary winding by the primary winding and the d-c component fed into the secondary winding by the supplemental voltage source 15 is equal to the current in the primary winding. Thus, accurate transmission of signals with d-c and a-c components is also possible in this transformer. Voltage source 15 can include an integrator and amplifier such as integrator 9 and amplifier 8 of FIG. 3, or, the integration can be performed by utilizing the integrator-like behavior of the transformer when voltage is considered as input and current as output. In the case, 15 is a low output resistance amplifier.

Figure 5:
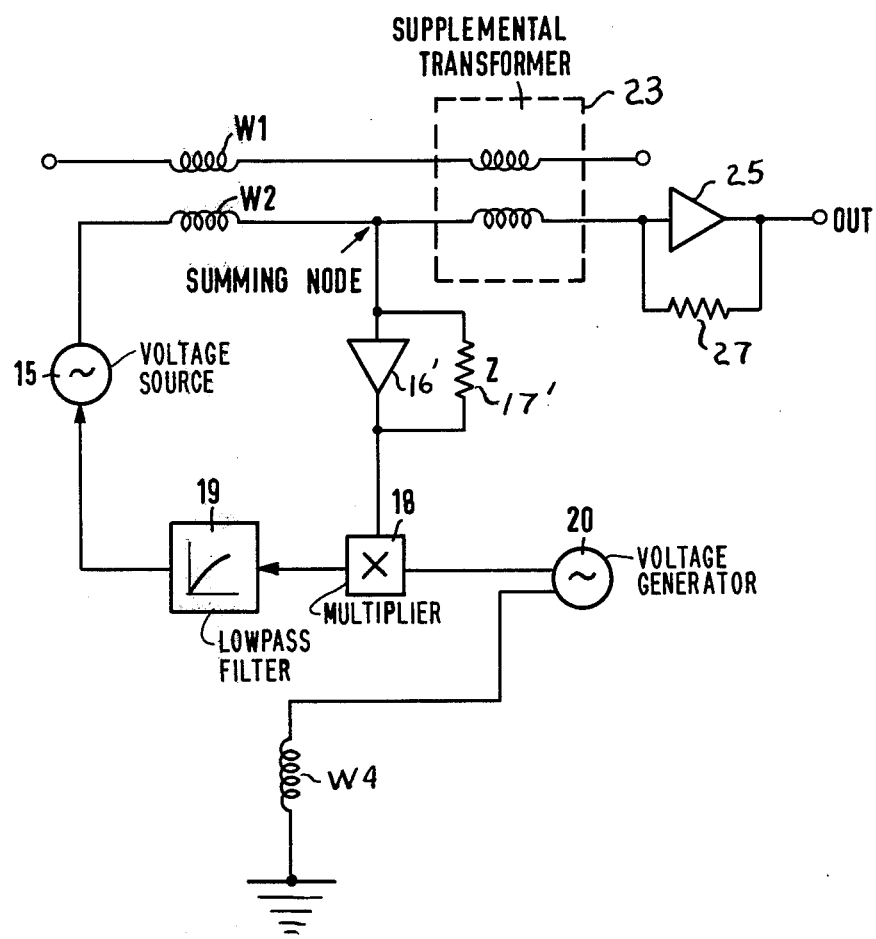
FIG. 5 is a schematic diagram of an embodiment of the present invention utilizing a supplemental tranformer.

If the frequency of the a-c component contained in the signal to be transmitted is close to the frequency of the signal delivered by the frequency generator 20 to the third multiplier stage 18, it is advantageous to provide a supplemental transformer 23 as shown on FIG. 5. As illustrated, the primary winding of the supplemental transformer 23 is connected in series with the primary winding W1 of the core. The value proportional to the current flowing in the secondary winding of the supplemental transformer is formed and added to the current in the winding W2 at the input of an amplifier $16^1$, having a feedback resistor $17^1$, the output of which is coupled to the third multiplier stage 18. The final circuit output is taken from the other side of the secondary of the supplemental transformer through an amplifier 25 having a feedback resistor 27. Such a supplemental transformer can improve the transmission accuracy substantially if the above mentioned frequencies are close together or even equal.

A change of the permeability of the core can also be achieved in a purely mechanical manner, by, for instance, providing an air gap, in the core, into which a ferromagnetic part is inserted periodically and removed again therefrom.

What is claimed is:

1. A transformer for d-c and a-c signals comprising:
   (a) a ferromagnetic core capable of having therein two independent magnetic fluxes;
   (b) a primary winding wound on said core;
   (c) a secondary winding wound on said core;
   (d) a supplemental winding, wound on said core, for changing the permeability of said core;
   (e) means for supplying a periodically changing current coupled to said supplemental winding to produce a secondary magnetic flux in said core which is independent of the magnetic flux of said primary and said secondary windings;
   (f) means for measuring the change in the magnetic characteristics in said core; and
   (g) means responsive to said means for measuring to supply a d-c current to said secondary winding, which current acts to cancel the effect of the permeability change on said means for measuring to thereby force equalization of the magnetization in said primary and said secondary windings.

2. A transformer according to claim 1 wherein said means for measuring are adapted to measure the change in the flux occurring when permeability changes.

3. A transformer according to claim 1 wherein said means for measuring are adapted to measure the change in magnetization occurring when permeability changes.

4. A transformer according to claim 1 wherein said measuring means comprises an auxiliary winding which is linked with the same magnetic flux as said primary and secondary windings.

5. A transformer according to claim 4 wherein said means for measuring are adapted to measure the change in the flux occurring when permeability changes.

6. A transformer according to claim 1 wherein said core is of the E-type having on its middle leg said primary, secondary and auxiliary windings and wherein said supplemental winding comprises two series connected subwindings with the same number of turns arranged on the two outer legs with a winding sense such that the outer legs are magnetized in opposite directions.

7. A transformer according to claim 1 wherein said core is designed as a cup core with a central hole and where said supplementary winding comprises at least one current carrying conductor brought through said central hole.

8. A transformer according to claim 1, wherein said means for supplying supplies a current which changes between a positive and a negative maximum of equal magnitude.

9. A transformer according to claim 8, wherein the value of the positive and negative maximum is limited as a function of the flux deviation brought about by the supplemental winding.

10. A transformer according to claim 1, wherein said means for measuring act as a voltage transformer and said means to supply comprise a supplemental current source.

11. A transformer according to claim 10, wherein said measuring means comprises an auxiliary winding which is linked with the same magnetic flux as said primary and secondary windings, and wherein said supplemental current source comprises an amplifier having its output coupled to said secondary winding, means to sense the current in said supplemental winding and provide an output voltage proportional thereto, a first multiplier having its inputs coupled to said means to sense to thereby square said voltage, means to differentiate having an input coupled to the output of said first multiplier, a second multiplier having as inputs the output of said auxiliary winding and the output of said differentiator and providing its output to the input of said amplifier.

12. A transformer according to claim 1, wherein said means for measuring act as a current transformer and said means to supply comprise a supplemental voltage source.

13. A transformer according to claim 12 wherein said means for measuring are adapted to measure the change in magnetization occurring when permeability changes.

14. A transformer according to claim 12 wherein said means for supplying has a second output with a frequency which is twice the frequency of the current supplied to the supplemental winding and a phase which coincides with the fundamental of the square of the current supplied to the supplemental winding and further including a multiplier having as inputs said second output and a value proportional to the magnetization in said secondary winding and a smoothing member having as an input the output of said multiplier and providing its output to said a supplemental voltage source.

15. A transformer according to claim 14 and further including a supplementary transformer, the primary winding of which is connected in series with the primary winding, and means to add a value proportional to the current in the secondary winding of said supplementary transformer to the value proportional to the magnetization of the secondary winding of said core and provide the sum so obtained to the one input of said multiplier.

* * * * *